United States Patent
Sandhu

(10) Patent No.: US 8,631,510 B2
(45) Date of Patent: Jan. 14, 2014

(54) MAGNETIC SENSOR AND SCANNING MICROSCOPE

(75) Inventor: Adarsh Sandhu, Tokyo (JP)

(73) Assignee: Empire Technology Development LLC, Wilmington, DE (US)

(*) Notice: Subject to any disclaimer, the term of this patent is extended or adjusted under 35 U.S.C. 154(b) by 259 days.

(21) Appl. No.: 13/314,894

(22) Filed: Dec. 8, 2011

(65) Prior Publication Data

US 2012/0079636 A1 Mar. 29, 2012

Related U.S. Application Data

(63) Continuation of application No. 12/665,613, filed as application No. PCT/JP2008/056058 on Mar. 28, 2008, now Pat. No. 8,104,093.

(51) Int. Cl.
*G01R 33/12* (2006.01)

(52) U.S. Cl.
CPC .................. *G01R 33/12* (2013.01)
USPC ............ 850/46; 850/49; 324/252; 324/244

(58) Field of Classification Search
USPC ............... 850/46, 49; 324/251, 252, 244
See application file for complete search history.

(56) References Cited

U.S. PATENT DOCUMENTS

| | | | |
|---|---|---|---|
| 5,313,451 A | 5/1994 | Yagi et al. | |
| 6,396,261 B1 * | 5/2002 | Martchevskii et al. | 324/235 |
| 6,717,402 B2 * | 4/2004 | Mukasa et al. | 324/252 |
| 7,555,333 B2 | 6/2009 | Wang et al. | |
| 8,104,093 B2 | 1/2012 | Sandhu | |
| 2006/0163767 A1 | 7/2006 | van der Weide et al. | |

FOREIGN PATENT DOCUMENTS

| | | |
|---|---|---|
| JP | H04-001949 | 1/1992 |
| JP | 07-245432 | 9/1995 |
| JP | 9-257810 | 10/1997 |
| JP | 11-101810 | 4/1999 |
| JP | H11-271345 | 10/1999 |
| JP | 2001-264231 | 9/2001 |
| JP | 2004-226292 | 8/2004 |
| JP | 2005-529754 A | 10/2005 |
| JP | 2007-329420 A | 12/2007 |
| WO | WO-2009/118887 | 10/2009 |

OTHER PUBLICATIONS

Nakamura, M., et al., "Scanning magnetoresistance microscopy with a magnetoresistive sensor cantilever," Applied Physics Letters, 2002, vol. 80, Issue: 15, pp: 2713-2715.

(Continued)

*Primary Examiner* — Kiet T Nguyen
(74) *Attorney, Agent, or Firm* — Foley & Lardner LLP

(57) ABSTRACT

An object of the present invention is to provide a magnetic sensor simply configured so as to magnetically measure not only conductive materials but also nonconductive materials over a wide temperature range and which offers high performance and high reliability, as well as a scanning microscope that uses the magnetic sensor. A scanning microscope according to the present invention includes a magnetic sensor with a magnetic sensing element provided at a free end of a cantilever-like flexible member and a strain gauge installed on the flexible member, driving means for driving the flexible member or a measurement sample, and control means for controlling driving provided by the driving means based on an output signal from the strain gauge.

22 Claims, 8 Drawing Sheets

(56) References Cited

OTHER PUBLICATIONS

Partial English Machine Translation of JP2001-264231A, paragraph Nos. [0036] and [0037], 1 page, Sep. 26, 2001.
Partial English Machine Translation of JPH11-271345A, paragraph Nos. [0098] and [0099], 1 page, Oct. 8, 1999.
Okuda, et al. "Vortex State in $Bi_2Sr_2CaCu_2O_{8+y}$ Measured by Scanning Hall Probe Microscope," vol. 53, Issue 1, Part 3, p. 359-746, Meeting Abstracts of the Physical Society of Japan, Mar. 10, 1998, ISSN 1342-8349 (including Partial English Machine Translation).
Japanese Office Action for 2009-529440 mailed Jul. 6, 2010 (with English translation).
Office Action for JP 2009-529440 mailed Jan. 21, 2010 (with English translation).
A. Oral, et al., "Real-time scanning Hall probe microscopy", Appl. Phys. Lett. 69(9), p. 1324-1326, 1996.
A. J. Brook, et al., "Integrated piezoresistive sensors for atomic force-guided scanning Hall probe microscopy", Applied Physics Letters, May 19, 2003, vol. 82, No. 20, p. 3538-3540.
International Search Report for PCT/JP2008/056058 mailed Jun. 17, 2008, (English translation provided).

* cited by examiner

MAGNETIC SENSOR AND SCANNING MICROSCOPE

CROSS-REFERENCE TO RELATED PATENT APPLICATIONS

This application is a continuation of U.S. application Ser. No. 12/665,613, which was filed on Feb. 12, 2010, as a national-stage application of PCT/JP2008/056058, which was filed on Mar. 28, 2008. Each of the above-referenced applications is incorporated herein by reference in its entirety.

TECHNICAL FIELD

The present invention relates to a magnetic sensor and a scanning microscope that uses the magnetic sensor.

BACKGROUND ART

A scanning probe microscope (SPM: Scanning Probe Microscopy) is an apparatus configured to measure and map the surface structure and physical properties of a measurement sample. Depending on the physical properties to be measured, various scanning probe microscopes have been developed, such as scanning tunneling microscopes (STM: Scanning Tunneling Microscope) and atomic force microscopes (AFM). In particular, a scanning Hall probe microscope (SHPM: Scanning Hall Probe Microscopy) is a measuring apparatus that is useful for quantitatively and directly observing magnetic domains; the scanning Hall probe microscope is configured to detect leakage magnetic fields from a magnetic material or a magnetic medium and to measure the physical quantity distribution of magnetic properties of the leaking magnetic fields and display the distribution as an image. Known scanning probe microscopes are described in, for example, Non-Patent Document 1 and Patent Document 1.
[Non-Patent Document 1] "Real-time scanning Hall probe microscopy," Appl. Phys. Lett, 69, pp. 1324-1326, (1996)
[Patent Document 1] Japanese Patent Laid-Open No. 2004-226292

The conventional scanning Hall probe microscope described in Non-Patent Document 1 uses a Hall probe including an STM chip and a Hall element integrated together to perform magnetic imaging measurement. The Hall probe is fixed to the leading end of a tube-like piezoelectric (PZT) actuator. The Hall probe is kept in proximity to the surface of a measurement sample until a tunnel current starts to flow between the STM chip and the measurement sample. A feedback circuit in the Hall probe monitors the tunnel current. Thus, the Hall probe kept at a given distance from the measurement sample (lift mode) scans the surface of the measurement sample.

However, the measurement using the Hall probe with the STM chip as described above is limited to measurement samples with conductive surfaces. Furthermore, a complicated electronic circuit is required to monitor the tunnel current. Moreover, since the Hall probe is separated from the surface of the measurement sample, it is difficult to achieve measurement at a sufficiently high sensitivity and a sufficiently high spatial resolution using weaker magnetism. Additionally, the Hall probe fixed to the piezoelectric actuator floats at a short distance (for example, several nm) from the surface of the measurement sample. Thus, upon undergoing a certain external impact during measurement, the Hall probe may come into contact (interfere) with the measurement sample. As a result, one or both of the Hall probe and the measurement sample may be damaged accidentally or over time.

Furthermore, the Hall probe is swung along the surface of the measurement sample using the portion thereof fixed to the piezoelectric actuator as a support point, to subject the surface of the measurement sample to fine (micromotion) scanning. Thus, a gradual increase in swing angle progressively increases the distance between the Hall probe and the measurement sample. This reduces the resolution of measurement images in the scanning direction, making the images blurred. Moreover, a high voltage required to control the piezoelectric actuator may induce spurious noise and the like.

Moreover, to allow the vortex state of a superconductive material or the like to be observed, the measurement sample and the Hall probe need to be cooled to a liquid helium temperature. However, the tube-like piezoelectric actuator offers a very narrow displacement range at such very low temperature, thus limiting the scan range of the Hall probe to about 1 µm×1 µm. This prevents the measurement sample from being observed over a wide range. To solve this problem, the present inventors have proposed a configuration in which the piezoelectric element described in Patent Document 1 is installed in a room temperature environment. The present inventors have thus successfully applied the scanning Hall probe microscope to very low temperature. However, this apparatus has a slightly complicated configuration and requires an increased installation area for the members thereof. Thus, there has been a demand for a further reduction in the scale of the apparatus.

SUMMARY

The present invention has been developed in view of the above-described circumstances. An object of the present invention is to provide a magnetic sensor simply configured so as to magnetically measure not only conductive materials but also nonconductive materials over a wide temperature range and which offers high performance and high reliability, as well as a scanning microscope that uses the magnetic sensor.

To accomplish the above-described object, a magnetic sensor comprises a cantilever-like flexible member, a magnetic sensing element provided at a free end of the flexible member, and a strain gauge provided on at least a part of the flexible member.

In the magnetic sensor configured as described above, when the magnetic sensing element comes into abutting contact with the surface of the measurement sample, the flexible member shaped like a cantilever bows to reduce the pressing force of the magnetic sensing element applied to the surface of the measurement sample. In conjunction with this, the strain gauge provided on at least a part of the flexible member (for example, on the surface of the flexible member if the flexible member is shaped like a plate) is deformed to provide a detection signal (for example, an output voltage obtained when an input voltage is applied to a bridge circuit). Then, the detection signal is monitored to allow detection of the bowing of the flexible member, that is, the abutment contact between the magnetic sensing element and the measurement sample. Magnetic measurement is performed with the magnetic sensing element in abutting contact with the measurement sample. This eliminates the need for an ATM chip provided on the conventional Hall probe. Furthermore, the magnetic sensor offers improved sensitivity, and eliminates the need for micromotion control required for the conventional piezoelectric actuator.

Furthermore, the type of the magnetic sensing element is not particularly limited. The magnetic sensing element is, for example, a Hall element or a magnetoresistive element. In view of the above-described conventional problems, the present invention is particularly useful when the magnetic sensing element is a Hall element.

Moreover, to be more reliably inhibited from being damaged upon coming into contact with the measurement sample, the magnetic sensing element may be coated with a protective film. In this case, the protective film may be thin enough to be prevented from reducing the sensitivity of the magnetic sensing element. Furthermore, the protective film usefully has a higher "hardness" than a material for the magnetic sensing element to provide a sufficient protective function for the magnetic sensing element, and may have a lower "hardness" than the measurement sample in order to protect the measurement sample. The "hardness" may be compared in terms of any of indentation hardness, scratch hardness, and rebound hardness. Examples of such hardness include Brinell hardness, Vickers hardness, Knoop hardness, Rockwell hardness, superficial hardness, Meier hardness, durometer hardness, Barcol hardness, Mnotron hardness, Martens hardness, and Shore hardness.

Moreover, a material for the flexible member is not limited; the flexible member may be formed of, for example, resin. For example, the cantilever-like member has a monolithic structure integrated with magnetic sensing element. In this case, the cantilever-like member requires micromachining technique. Furthermore, if the magnetic sensing element has a multilayer structure, the cantilever-like member may be difficult to process. In contrast, resins are inexpensive materials that are easy to handle and process. There are many types of resin, and the flexibility and environment resistance of the resin can be easily set by appropriately adjusting the type or thickness of the resin.

Furthermore, a scanning microscope according to the present invention is effectively configured using the magnetic sensor according to the present invention. The scanning microscope comprises a cantilever-like flexible member, a magnetic sensing element provided at a free end of the flexible member, a strain gauge provided on at least a part of the flexible member, driving means for driving the flexible member or a measurement sample, and control means for controlling driving provided by the driving means based on an output signal from the strain gauge. Furthermore, the magnetic sensing element is usefully a Hall element. At least an area of the magnetic sensing element which comes into contact with the measurement sample may be coated with a protective film. The flexible member may be formed of, for example, a resin. In addition, the driving section (means) may be of a non-piezoelectric element type. Moreover, the control means may control the driving means so that the magnetic sensing element and the measurement sample are adjustably brought into abutting contact with each other or separated from each other, based on an output signal from the strain gauge.

Advantage of the Invention

The magnetic sensor and scanning microscope according to the present invention enable not only conductive materials but also nonconductive materials to be magnetically detected and eliminate the need for an actuator that uses a piezoelectric element or the like to drive the magnetic sensor, allowing the apparatus configuration of the apparatus to be simplified. Furthermore, the scan range at very low temperature can be sufficiently increased, enabling magnetic measurement over a wide temperature range. Moreover, sensitive magnetic detection can be achieved with the sensor in contact with or in close proximity to the measurement sample. As a result, the magnetic measurement performance and reliability of the sensor and apparatus can be drastically improved.

DETAILED DESCRIPTION

Figure 1:
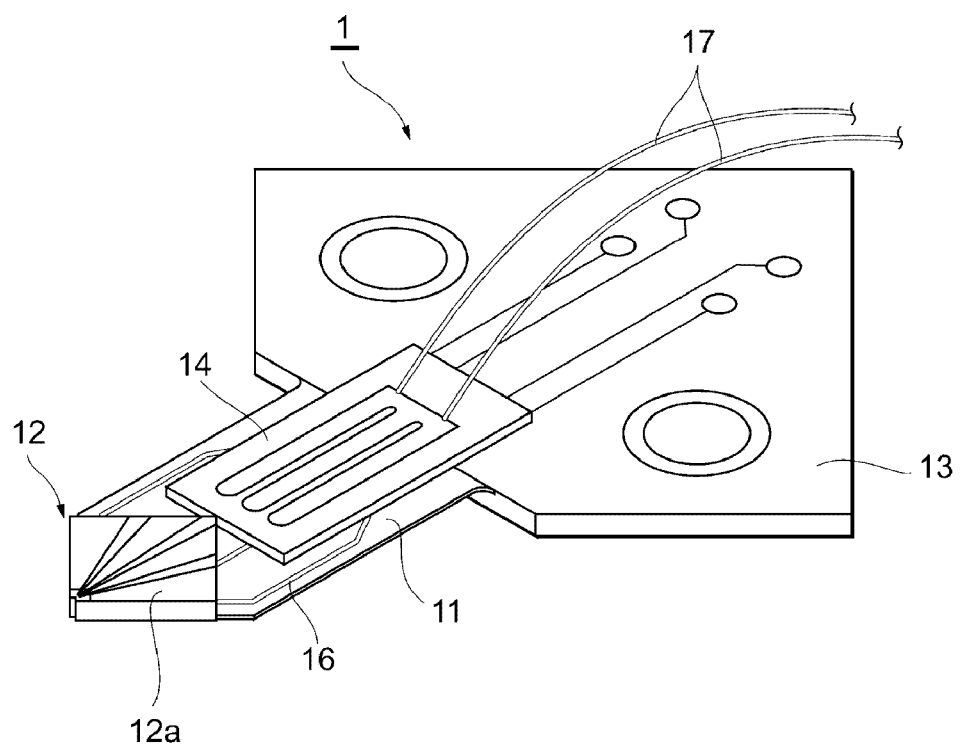
FIG. 1 is a perspective view schematically showing the configuration of an embodiment of a magnetic sensor according to the present invention.

An embodiment of the present invention will be described below. The same elements are denoted by the same reference numerals, and duplicate descriptions are omitted. Furthermore, positional relations in the up-down direction, the lateral direction, and the like are based on those shown in the drawings unless otherwise specified. Moreover, the dimensional ratio is not limited to those shown in the drawings. Additionally, the embodiment described below only illustrates the present invention and is not intended to limit the present invention thereto. Moreover, the present invention can be varied without departing from the spirit thereof.

Figure 2:
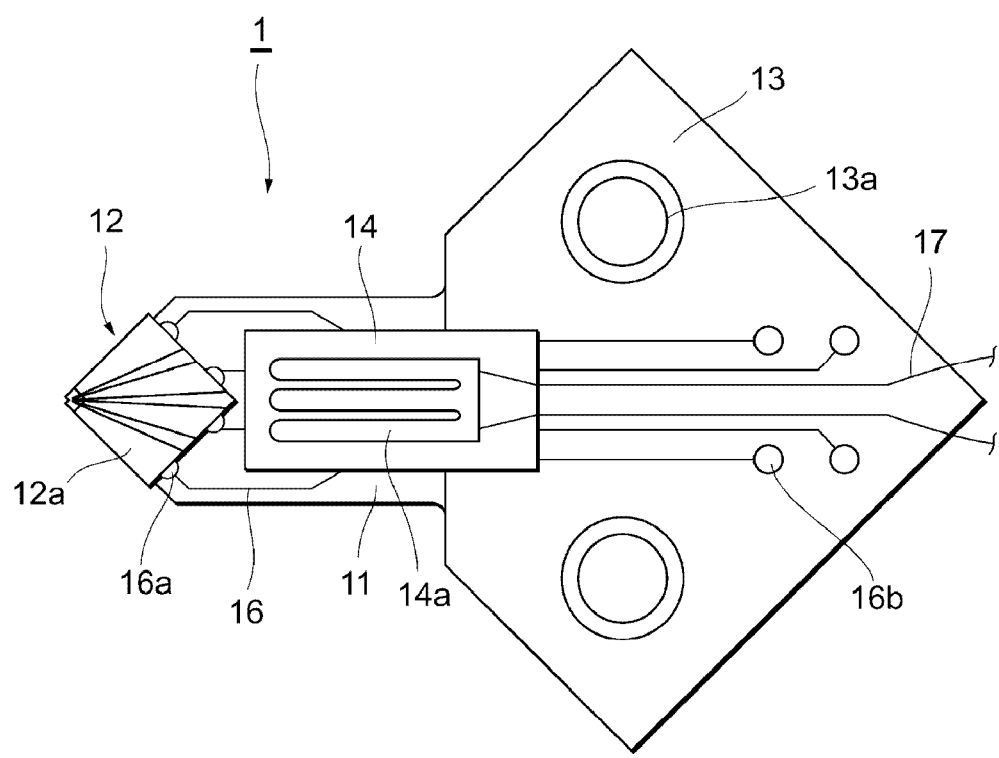
FIG. 2 is a plan view schematically showing the configuration of the embodiment of the magnetic sensor according to the present invention.
Figure 3:
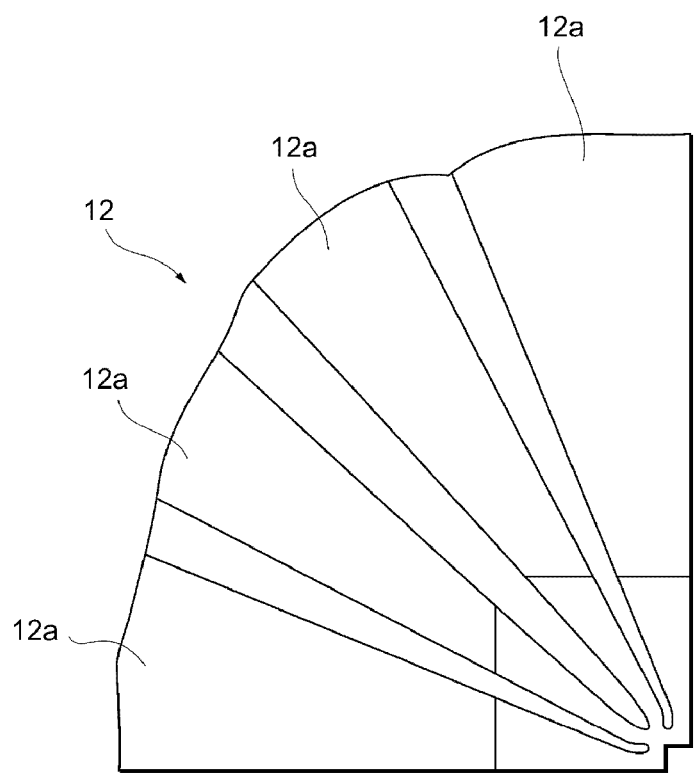
FIG. 3 is an enlarged schematic plan view showing a part of the embodiment of the magnetic sensor according to the present invention.

FIGS. 1 and 2 are a perspective view and a plan view schematically showing an embodiment of a magnetic sensor according to the present invention. FIG. 3 is a partly enlarged schematic plan view of a part of the magnetic sensor.

The magnetic sensor 1 includes a Hall element section 12 (magnetic sensing element) located at one end of a resin plate 11 (flexible member) that appears to be rectangular in a plan view; the Hall element section 12 appears to be generally rectangular in a plan view and includes a plurality of probes 12a formed substantially like radially arranged strips of paper. The Hall element section 12 includes, for example, an active area of about several µm×several µm. The Hall element section 12 is manufactured by forming a two-dimensional electron gas (2DEG) AlGaAs/InGaAs hetero structure on a GaAs substrate by epitaxial growth in which the vapor phase of an organic metal material is used as a material gas, and processing the hetero structure into a desired shape by photolithography.

Furthermore, the Hall element section 12 is covered with a protective film (not shown in the drawings) that protects both the Hall element section 12 and the surface Sa of a measurement sample S (described below) that comes into contact with the Hall element section 12. The type and material of the protective film are not particularly limited. For example, the protective film is harder (has a higher "hardness") than the material for the Hall element section 12, and is softer (has a lower "hardness") than the surface Sa of the measurement sample S in terms of protection of the surface Sa. More specifically, an example of the protective film is an organic nitride such as silicon nitride. The thickness of the protective film is also not particularly limited; the protective film is, for example, a thin film having a thickness of about 50 nm in order to prevent a decrease in the magnetic detection sensitivity of the Hall element section 12.

Moreover, each of the probes 12a of the Hall element section 12 has wires 16 formed of Au or the like and connected to the base end thereof via respective electrode pads 16a formed of Au or the like. Each of the wires 16 is stuck to the surface of the resin plate 11 and extended under a strain gauge 14 described below to a terminal 16b on a base 13. If the joint strength between the resin plate 11 and the wires 16 is insufficient, the wires 16 and/or electrode pads 16a may be formed of, for example, a conductive medium such as conductive paste which contains conductor colloids.

Furthermore, the resin plate 11 is formed of a resin film such as polyimide resin and is thus flexible. An end of the resin plate 11 which is opposite the end including the Hall element section 12 is fixed to the base 13, which is thicker than the resin plate 11. That is, the resin plate 11 is shaped like a cantilever such that the end at which the Hall element section 12 is fixed functions as a free end, whereas the end fixed to the base 13 functions as a fixed end.

Moreover, a thin film-like strain gauge 14 is installed so as to extend from a central portion of the resin plate 11 onto the base 13. An I/O gauge lead 17 is connected to the base of a resistor grid 14a of the strain gauge 14. The strain gauge 14 can be appropriately selected from commonly commercially available ones. For example, the resistor grid 14a composed of a thin film Cu—Ni is formed as a film on a resin film such as a polyimide film. Furthermore, for example, the strain gauge 14 is a film that is thin to the degree that the flexibility of the resin plate 11 is not affected.

Figure 4:
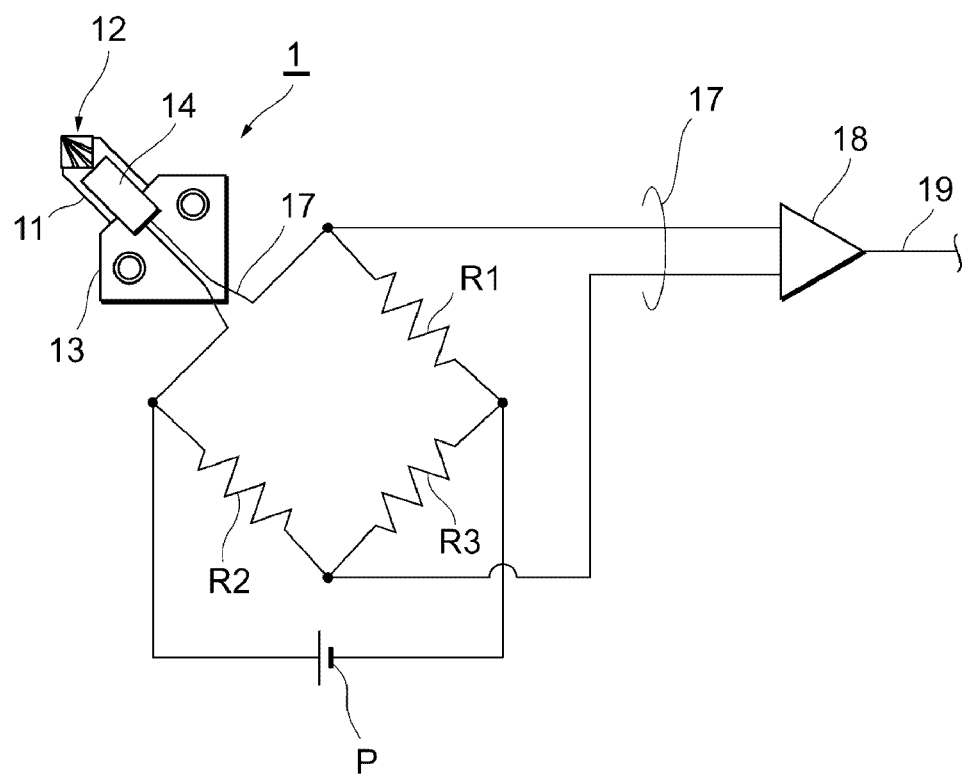
FIG. 4 is a circuit diagram showing an example of a bridge circuit configured to measure a variation in the resistance of a strain gauge.

FIG. 4 is a circuit diagram (wiring diagram) showing an example of a bridge circuit configured to measure a variation in the resistance of the strain gauge 14. The bridge circuit is of a Wheatstone type widely used to measure a variation in the resistance of the strain gauge 14. In response to an appropriate input voltage P, the bridge circuit outputs an output voltage 19 through a gain amplifier 18. For example, for the strain gauge 14, resistors R1 and R2 have a resistance value of about 100Ω, and a resistor R3 is used as a variable resistance.

Figure 5:
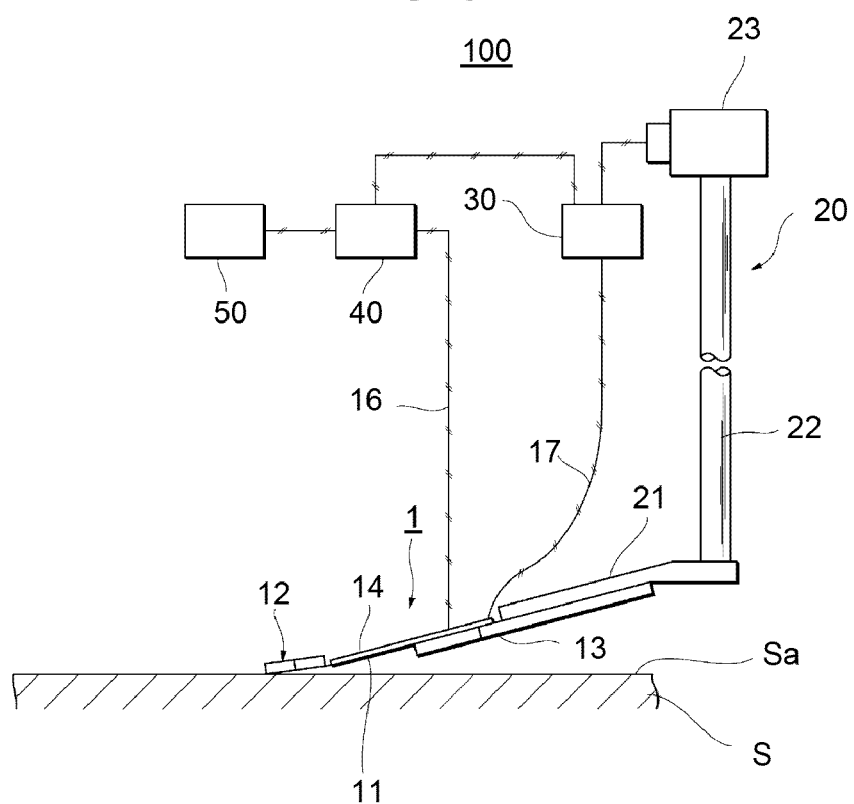
FIG. 5 is a schematic diagram showing the configuration of an embodiment of a scanning microscope according to the present invention.

FIG. 5 is a diagram schematically showing an example of a scanning Hall probe microscope comprising the magnetic sensor 1 shown in FIGS. 1 to 4 as an embodiment of a scanning microscope according to the present invention. A scanning Hall probe microscope 100 comprises a driving mechanism 20 (driving means) in which the upper end, in FIG. 5, of a movable shaft 22 with a holder 21 provided at the lower end thereof, in FIG. 5, is connected to a stepping motor 23. The base 13 of the magnetic sensor 1 is fixedly supported on an area of the holder 21 which is slightly inclined forward and downward, for example, at threaded portions 13a shown in FIG. 2. Thus, the magnetic sensor 1 as a whole is three-dimensionally driven, together with the holder 21 and the movable shaft 22, in an X direction, a Y direction, and a Z direction by the stepping motor 23. In this manner, the scanning Hall probe microscope 100 comprises no actuator of a piezoelectric element type that uses a piezoelectric element as driving means.

Furthermore, the gauge lead 17 of the strain gauge 14 is connected to a control circuit section 30 (control means) in which the bridge circuit shown in FIG. 4 described above is contained. The stepping motor 23 is connected to the control circuit section 30 via an I/O interface. On the other hand, the wires 16 connected the Hall element section 12 and drawn out via the terminals 16b on the base 13 are connected to a measurement circuit section 40. The control circuit section 30 and an image processing operation circuit 50 are connected to the measurement circuit section 40 via respective I/O interfaces.

To allow the magnetic domains of the surface Sa of the measurement sample S to be observed using the scanning Hall probe microscope 100 configured as described above, for example, the following procedure is carried out. That is, a balanced output voltage from the bridge circuit of the control circuit section 30 with the strain gauge 14 connected thereto is adjusted to zero (step 1). Then, with the balanced output voltage from the bridge circuit of the control circuit section 30 monitored, the stepping motor 23 is actuated to drive the movable shaft 22 in the Z direction (which is perpendicular to the surface Sa of the measurement sample S). Micromotion control is then performed to gradually lower the magnetic sensor 1 toward the surface Sa of the measurement sample S (step 2).

When the Hall element section 12 of the magnetic sensor 1 comes into abutting contact with the surface Sa of the measurement sample S, the resin plate 11 bows so as to be recessed. Thus, the strain gauge 14 installed on the resin plate 11 similarly bows. Then, the resistor grid 14a of the strain gauge 14 is deformed and expanded or contracted to change the electric resistance thereof. The bridge circuit outputs a corresponding voltage signal (the balanced voltage deviates from zero). At this time, the control circuit section 30 provides a control signal to instantaneously stop driving of the stepping motor 23 (step 3). Then, with the Hall element section 12 of the magnetic sensor 1 maintained in abutting contact with the surface Sa of the measurement sample S, the stepping motor 23 is actuated in the X-Y direction (the direction parallel to the surface Sa of the measurement sample S). Thus, the magnetic sensor 1 starts measuring magnetic domains (step 4: contact mode). A measurement signal from the magnetic sensor 1 is arithmetically processed by the measurement circuit section 40 and the image processing operation circuit 50. For example, a visualized image of the distribution of the magnetic domains is output to a monitor or the like provided in the image processing operation apparatus 50. The image is also recorded in a recording medium or the like.

Alternatively, if the bridge circuit of the control circuit section 30 outputs a voltage signal, the operation direction of the stepping motor 23 is switched to raise the magnetic sensor 1 from the current position thereof. When the voltage output from the bridge circuit of the control circuit section 30 is zeroed again, the driving of the stepping motor 23 is instantaneously stopped (step 3'). The currently available stepping motor 23 can perform control such that the magnetic sensor 1 is stopped at an appropriate position to an accuracy of about 100 nm. Thus, the magnetic sensor 1 is positioned slightly above the surface Sa of the measurement sample S. That is, the magnetic sensor 1 is positioned in close proximity to the surface Sa of the measurement sample S but not in contact with the surface Sa (non-contact state). Thereafter, with this state maintained, the above-described step 4 can be carried out (non-contact mode) to observe the magnetic domains of the measurement sample S. As described above, the control circuit section 30 may control the driving mechanism 20 so that the Hall element section 12 and the measurement sample S are adjustably brought into abutting contact with each other or separated from each other, based on the output signal from the strain gauge 14.

Figure 6:
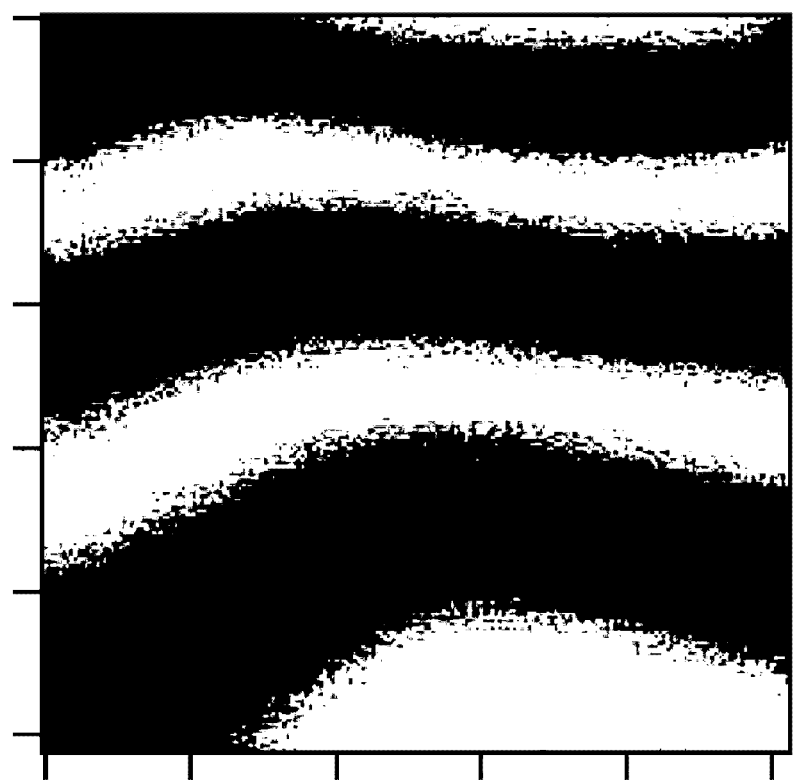
FIG. 6 is a two-dimensionally visualized image obtained by measuring the magnetic domains on the surface of a thin iron garnet film using an example of the scanning microscope according to the present invention.
Figure 7:
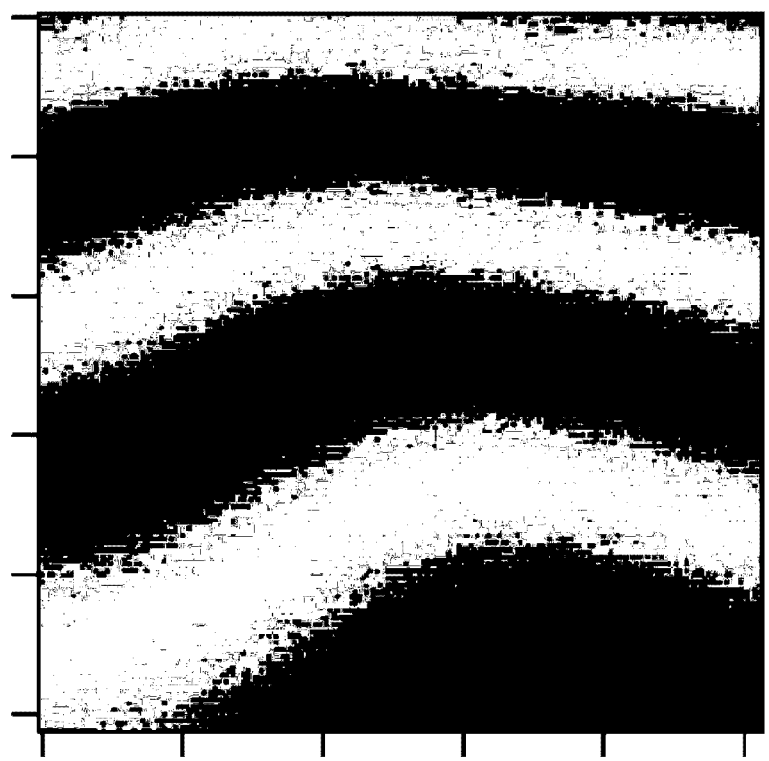
FIG. 7 is a two-dimensionally visualized image obtained by measuring the magnetic domains on the surface of the thin iron garnet film using the example of the scanning microscope according to the present invention.
Figure 8:
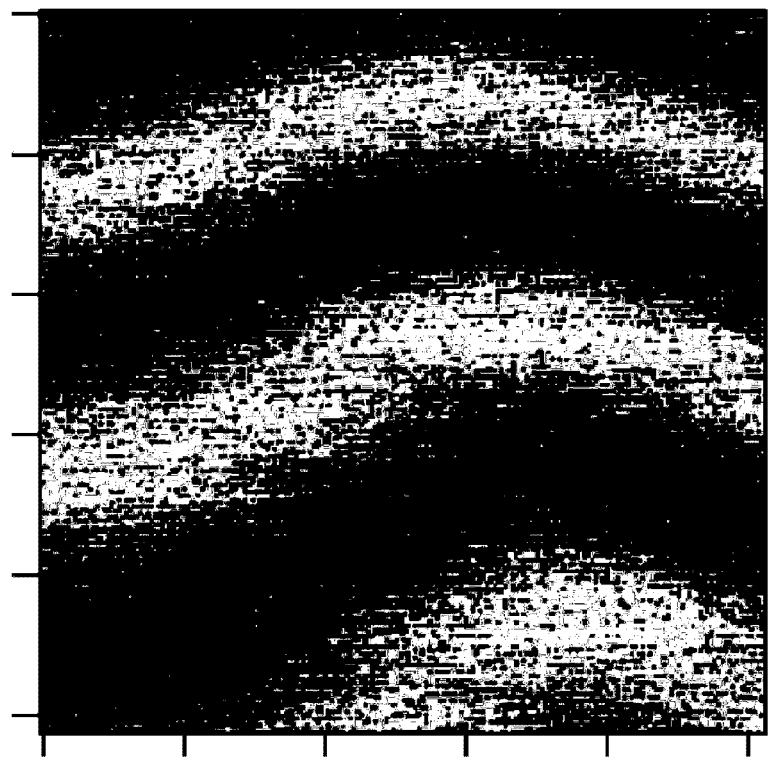
FIG. 8 is a two-dimensionally visualized image obtained by measuring the magnetic domains on the surface of the thin iron garnet film using the example of the scanning microscope according to the present invention.

FIGS. 6 to 8 show an example of a two-dimensionally visualized image obtained by measuring the magnetic domains in a 50 μm×50 μm area on the surface of a thin iron garnet film of thickness 50 μm using an apparatus configured similarly to that of the scanning Hall probe microscope 100. FIGS. 6 to 8 show the results of scanning with the magnetic sensor 1 positioned in contact with the measurement sample (contact mode), the results of scanning with the magnetic sensor 1 positioned about 0.5 μm above the measurement sample (non-contact mode), and the results of scanning with the magnetic sensor 1 positioned about 1 μm above the measurement sample (non-contact mode), respectively.

In the measurement, the specified characteristics of the magnetic sensor 1 were such that the room-temperature electron mobility and sheet carrier concentration of two-dimensional electron gas (2DEG) induced by the heterojunction of the Hall element section 12 were 6,900 cm$^2$/Vs and $3.1 \times 10^{12}$ cm$^{-2}$, respectively, and that the Hall coefficient and series resistance of the sensor 1 were 0.001 Ω/G and 7.0 kΩ, respectively. Furthermore, the driving current for the Hall element section 12 was constantly set to 40 μA. Additionally, in the present measurement, the surface magnetic field of the measurement sample varied by ±212 G. The results indicate that in the contact mode, magnetic distribution images are obtained which exhibit higher sensitivity and higher definition than in the non-contact mode.

As described above, the magnetic sensor 1 and scanning Hall probe microscope 100 according to the present invention enable the magnetic domains to be observed without using an AFM probe that utilize a tunnel current. Thus, the magnetic sensor 1 and scanning Hall probe microscope 100 can be applied to technical fields such as the magnetic measurement not only of conductive materials but also of nonconductive materials, for example, magnetic measurement for detecting Hall-like defects in nonmagnetic metal piping. Furthermore, no actuator using a piezoelectric element is required to drive the magnetic sensor 1. Consequently, the apparatus configuration of the scanning Hall probe microscope 100 can be simplified. Additionally, the scan range at very low temperature can be sufficiently increased, enabling magnetic measurement over a wire temperature range. Moreover, sensitive magnetic detection can be achieved with the magnetic sensor in contact with or in close proximity to the measurement sample. As a result, the magnetic measurement performance and reliability of the sensor and apparatus can be drastically improved.

Note that, as described above, the present invention is not limited to the above-described embodiments. The embodiments can be appropriately varied without departing from the spirit of the present invention. For example, instead of the Hall element section 12, a magnetoresistive sensor that uses a magnetic resistor probe may be used as the magnetic sensor 1. Furthermore, in the magnetic sensor 1, the Hall element section 12 need not necessarily be covered with a protective film. Moreover, if the pressure at which the Hall element section 12 is in abutting contact with the measurement sample S can be sensed based on the amount by which the flexible resin plate 11 bows, that is, a strain amount signal from the strain gauge 14, then the stepping motor 23 may be drivingly controlled such that the appropriate abutting contact pressure is maintained during scanning. Moreover, the measurement sample S may be driven by the driving mechanism 20 with the magnetic sensor 1 fixed.

As described above, the magnetic sensor and scanning microscope according to the preset invention are very simply configured to allow not only conductive materials but also nonconductive materials to be magnetically sensitively measured over a wide temperature range. Thus, the magnetic sensor and scanning microscope according to the preset invention can be widely utilized in various magnetic measurement devices, apparatuses, systems, facilities, and the like as well as the manufacture thereof.

The invention claimed is:

1. A magnetic sensor comprising:
   a flexible member;
   a magnetic sensing element disposed on the flexible member and configured to provide a measurement signal representing one or more magnetic domains of a sample; and
   a resistor grid disposed on the flexible member and configured to provide a variation in resistance representing a deformation of the flexible member.

2. The magnetic sensor of claim 1, wherein the flexible member comprises a resin.

3. The magnetic sensor of claim 2, wherein the resin is a polyimide resin film.

4. The magnetic sensor of claim 1, wherein the magnetic sensing element is configured to provide the measurement signal when disposed in abutting contact with the sample.

5. The magnetic sensor of claim 1, wherein the magnetic sensing element comprises a Hall element or a magnetoresistive element.

6. The magnetic sensor of claim 1, wherein the magnetic sensing element is coated with a protective film.

7. The magnetic sensor of claim 6, wherein the protective film has a thickness of about 50 nm.

8. The magnetic sensor of claim 6, wherein the protective film comprises an organic nitride or silicon nitride.

9. The magnetic sensor of claim 1, wherein the resistor grid comprises a thin film of Cu—Ni.

10. The magnetic sensor of claim 1, further comprising:
    a circuit in electrical communication with the resistor grid and configured to measure the variation in resistance provided by the resistor grid.

11. The magnetic sensor of claim 10, wherein the circuit is further configured to determine when the magnetic sensing element is in abutting contact with the sample based on the variation in resistance provided by the resistor grid.

12. The magnetic sensor of claim 1, further comprising:
    a measurement circuit section operably coupled to the magnetic sensing element and configured to process the measurement signal from the magnetic sensing element.

13. The magnetic sensor of claim 1, further comprising:
    an image processing operation circuit operably coupled to the magnetic sensing element and configured to provide an image of the one or more magnetic domains in the sample based on the measurement signal.

14. The magnetic sensor of claim 13, further comprising:
    a monitor operably coupled to the image processing operation circuit and configured to display the image of the one or more magnetic domains in the sample.

15. The magnetic sensor of claim 13, further comprising:
    a recording medium operably coupled the image processing operation circuit and configured to record the image of the one or more magnetic domains in the sample.

16. A method of measuring one or more magnetic domains in a sample, the method comprising:

providing a magnetic sensing element and a resistor grid on a flexible member;

measuring a variation in a resistance of the resistor grid caused by deformation of the flexible member;

determining whether the magnetic sensing element is in abutting contact with the sample based on the variation in resistance; and measuring the one or more magnetic domains in the sample with the magnetic sensing element.

17. The method of claim 16, further comprising:

processing the measurement signal from the magnetic sensing element.

18. The method of claim 17, further comprising:

providing an image of the one or more magnetic domains in the sample based on the measurement signal.

19. The method of claim 18, further comprising:

displaying the image of the one or more magnetic domains in the sample.

20. The method of claim 18, further comprising:

recording the image of the one or more magnetic domains in the sample.

21. A magnetic sensor comprising:

a flexible member;

a magnetic sensing element disposed on the flexible member and configured to provide a measurement signal representing a magnetic domain of a sample;

a resistor grid disposed on the flexible member and configured to provide a variation in resistance representing deformation of the flexible member;

a circuit in electrical communication with the resistor grid and configured to determine when the magnetic sensing element is in abutting contact with the sample based on the variation in resistance provided by the resistor grid; and a measurement circuit section operably coupled to the magnetic sensing element and configured to process the measurement signal from the magnetic sensing element.

22. The magnetic sensor of claim 21, further comprising:

an image processing operation circuit operably coupled to the magnetic sensing element and configured to provide an image of magnetic domains in the sample.

\* \* \* \* \*